United States Patent (10) Patent No.: US 11,778,724 B2
Fujimura (45) Date of Patent: Oct. 3, 2023

(54) CIRCUIT STRUCTURE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventor: Yuki Fujimura, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 300 days.

(21) Appl. No.: 17/295,211

(22) PCT Filed: Oct. 31, 2019

(86) PCT No.: PCT/JP2019/042822
§ 371 (c)(1),
(2) Date: May 19, 2021

(87) PCT Pub. No.: WO2020/105393
PCT Pub. Date: May 28, 2020

(65) Prior Publication Data
US 2022/0015220 A1 Jan. 13, 2022

(30) Foreign Application Priority Data
Nov. 21, 2018 (JP) .............................. JP2018-218130

(51) Int. Cl.
*H05K 1/02* (2006.01)
*H01H 9/52* (2006.01)
*H02G 5/10* (2006.01)

(52) U.S. Cl.
CPC ............ *H05K 1/0204* (2013.01); *H01H 9/52* (2013.01); *H02G 5/10* (2013.01)

(58) Field of Classification Search
CPC .. H05K 7/20; H05K 7/20236; H05K 7/20254; H05K 7/20272; H05K 7/2039;
(Continued)

(56) References Cited

U.S. PATENT DOCUMENTS

2002/0170732 A1* 11/2002 Chiriku ................ H01H 50/12
174/59
2012/0236503 A1 9/2012 Asada et al.
(Continued)

FOREIGN PATENT DOCUMENTS

JP 2004-134140 4/2004
JP 2005-184929 7/2005
(Continued)

OTHER PUBLICATIONS

Official Communication issued in International Bureau of WIPO Patent Application No. PCT/JP2019/042822, dated Dec. 24, 2019, along with an English translation thereof.

*Primary Examiner* — Amir A Jalali
(74) *Attorney, Agent, or Firm* — Greenblum & Bernstein, P.L.C.

(57) ABSTRACT

A first busbar includes a first electrical connection portion that is electrically connected to a main relay, a first heat transfer connection portion that is thermally connected to the insulating plate, and a first detour portion that connects the first electrical connection portion and the first heat transfer connection portion to each other. A second busbar includes a second electrical connection portion that is electrically connected to the main relay, a second heat transfer connection portion that is thermally connected to the insulating plate, and a lateral detour portion and a lower detour portion that connect the second electrical connection portion and the second heat transfer connection portion to each other.

6 Claims, 12 Drawing Sheets

(58) Field of Classification Search
CPC .... H05K 1/0204; H05K 1/0209; H05K 1/181; H01H 9/52; H01H 50/04; H01H 50/12; H01H 50/14; H01H 50/54; H01H 89/00; H01H 2050/049; H02G 5/10
See application file for complete search history.

(56) References Cited

U.S. PATENT DOCUMENTS

| | | | |
|---|---|---|---|
| 2013/0313915 A1* | 11/2013 | Hashimoto | H01H 50/021 |
| | | | 307/115 |
| 2017/0079129 A1 | 3/2017 | Chin | |
| 2017/0214230 A1 | 7/2017 | Yamane et al. | |
| 2019/0214805 A1* | 7/2019 | Hiramitsu | H05K 7/20272 |
| 2020/0055466 A1* | 2/2020 | Won | B60R 16/02 |
| 2020/0168419 A1* | 5/2020 | Fujimura | H01H 50/54 |
| 2022/0217865 A1* | 7/2022 | Fujimura | H01M 50/287 |
| 2022/0394873 A1* | 12/2022 | Kuzuhara | H01H 50/14 |

FOREIGN PATENT DOCUMENTS

| | | |
|---|---|---|
| JP | 2012-195492 | 10/2012 |
| JP | 2013-089768 | 5/2013 |
| JP | 2015-012627 | 1/2015 |
| JP | 2015-223044 | 12/2015 |
| JP | 2016-025673 | 2/2016 |
| JP | 2016-105678 | 6/2016 |
| JP | 2018-038128 | 3/2018 |

\* cited by examiner

FIG. 8
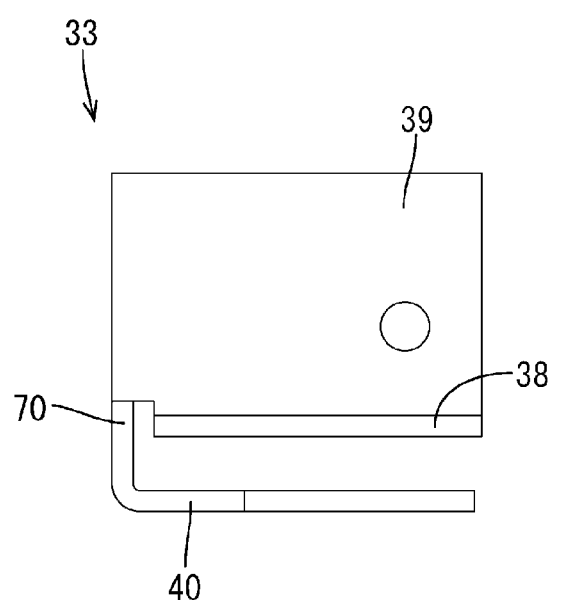
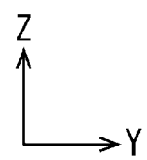

CIRCUIT STRUCTURE

TECHNICAL FIELD

The technology disclosed in the present specification relates to a circuit structure that has a heat generating component.

BACKGROUND ART

Conventionally, the relay described in JP 2004-134140A is known. A plurality of terminals project downward from the lower surface of a case of the relay. The terminals are connected to corresponding busbars. Heat generated by the relay when receiving electrical power is transferred from the terminals to the busbars. The terminals include a terminal for electrically connecting the relay and the corresponding busbar and a terminal for heat dissipation that transfers heat generated by the relay to the corresponding busbar when electrical power is supplied.

CITATION LIST

Patent Document

Patent Document 1: JP 2004-134140A

SUMMARY OF INVENTION

Technical Problem

In order to improve the heat dissipation of the relay, it is conceivable to increase the size of the heat dissipation busbar and increase the space for disposing the heat dissipation busbar. However, according to the above configuration, a circuit that is electrically connected to the relay is located at a position directly under the relay, and therefore there is a problem that it is not possible to secure sufficient space for disposing the heat dissipation busbar.

The technology disclosed in the present specification has been achieved based on the above circumstances, and an object is to improve the heat dissipation of a circuit structure.

Solution to Problem

A circuit structure according to the technology disclosed in the present specification includes: a heat generating component that generates heat when electrical power is supplied; a busbar including an electrical connection portion electrically connected to the heat generating component, a heat transfer connection portion provided at a different position from the electrical connection portion, and a detour portion that connects the electrical connection portion and the heat transfer connection portion to each other; a base member that has an upper surface on which the heat generating component is arranged and a lower surface, and includes a through hole that passes through the upper surface and the lower surface and accommodates the heat transfer connection portion; an insulating plate that is made of an insulating material and is arranged below the heat transfer connection portion; and a heat dissipation member that is made of a metal and is arranged below the insulating plate.

According to the above configuration, the detour portion connecting the electrical connection portion and the heat transfer connection portion to each other can have any shape, and therefore the heat transfer connection portion can be provided at a position separated from the heat generating component. This makes it possible to improve the heat dissipation of the circuit structure even if the base member cannot be provided with a through hole in the vicinity of the heat generating component.

The following aspects are preferable as embodiments of the technology disclosed in the present specification.

The heat generating component is a relay, the relay has a power terminal to which electrical power is supplied, and the electrical connection portion of the busbar is connected to the power terminal.

When electrical power is supplied to the relay, a relatively large amount of heat is generated by the powered power terminal. For this reason, due to providing the heat transfer connection portion in the busbar that is connected to the power terminal, heat can be efficiently transferred from the relay, and therefore the heat dissipation of the circuit structure can be improved.

A sub busbar different from the busbar is arranged on the insulating plate at a position corresponding to the heat generating component.

According to the above configuration, a sub busbar different from the busbar can be arranged on the insulating plate at a position corresponding to the heat generating component, thus making it possible to improve the degree of freedom in circuit design.

The sub busbar includes a precharge busbar that constitutes a precharge circuit connected in parallel to the relay.

According to the above configuration, the relay precharge circuit can be formed on the insulating plate at a position corresponding to the relay, and therefore the wiring density of the circuit structure can be improved.

The circuit structure further includes an insulating heat transfer sheet that is arranged at least one of between the heat transfer connection portion and the insulating plate and between the insulating plate and the heat dissipation member.

According to the above configuration, heat generated by the heat generating component can be efficiently transferred from the heat transfer connection portion to the heat dissipation member by the heat transfer sheet.

There are a plurality of the heat transfer sheets, including a first heat transfer sheet arranged between the heat transfer connection portion and the insulating plate and a second heat transfer sheet arranged between the insulating plate and the heat dissipation member.

According to the above configuration, it is possible to further improve the electrical insulation between the busbar and the heat dissipation member.

The heat transfer sheet is made of an elastically deformable material.

When electrical power is supplied, the busbar, the insulating plate, and the heat dissipation member expand due to the heat generated by the heat generating component. Since the coefficient of thermal expansion of the metal and the coefficient of thermal expansion of the insulating material are different, there is a risk that a gap may be formed between the busbar, the insulating plate, and the heat dissipation member. Since the thermal conductivity of air is very low, there is a concern that the heat dissipation of the circuit structure will decrease if a gap is formed. According to the above configuration, elastic deformation of the heat transfer sheet makes it possible to suppress the formation of a gap between the busbar, the insulating plate, and the heat dissipation member in at least in the portion where the heat transfer sheet is provided. Accordingly, the heat dissipation of the circuit structure can be improved.

The heat dissipation member includes a platform portion that projects toward the insulating plate from a position corresponding to the insulating plate.

According to the above configuration, the insulating plate can be pressed toward the heat transfer connection portion by the platform portion, thus making it possible to suppress the formation of a gap between the insulating plate and the heat transfer connection portion. Accordingly, the heat dissipation of the circuit structure can be improved.

The insulating plate is made of an insulating synthetic resin.

According to the above configuration, the insulating plate can be easily formed with a shape that corresponds to the shape of the heat transfer connection portion. Accordingly, heat can be efficiently transferred from the heat transfer connection portion to the insulating plate, and therefore the heat dissipation of the circuit structure can be improved.

Advantageous Effects of Invention

According to the technology disclosed in the present specification, the heat dissipation of a circuit structure can be improved.

BRIEF DESCRIPTION OF DRAWINGS

FIG. 8 is a side view showing the first busbar.

DESCRIPTION OF EMBODIMENTS

First Embodiment

Figure 1:
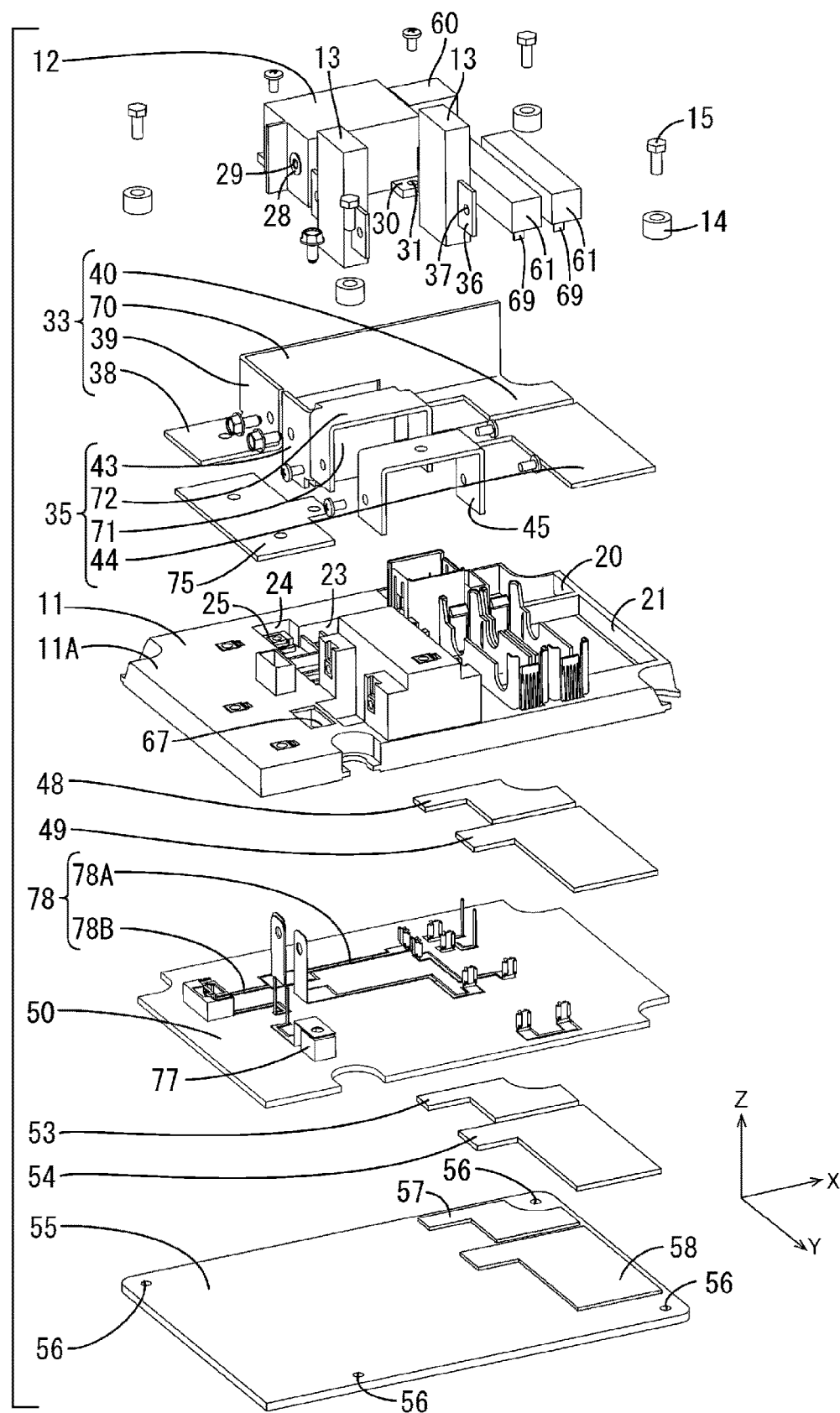
FIG. 1 is an exploded perspective view showing a circuit structure according to a first embodiment.

Hereinafter, a first embodiment in which the technology disclosed in the present specification is applied to a circuit structure 10 will be described with reference to FIGS. 1 to 12. The circuit structure 10 is installed in a vehicle (not shown) such as an electric automobile or a hybrid automobile, and is configured to supply power from a power source such as a battery (not shown) to a load such as a motor (not shown), and control the supply of power. The circuit structure 10 can be arranged in any direction, but in the following description, the Z direction is upward, the Y direction is forward, and the X direction is leftward. Also, when multiple members are the same, reference numerals may be given to some of the members and not to the other members.

As shown in FIG. 1, the circuit structure 10 includes electronic components such as a base member 11, a main relay 12 (an example of a heat generating component) arranged on the base member 11, fuses 13, a precharge relay 60, and a precharge resistor 61.

Base Member 11

Figure 4:
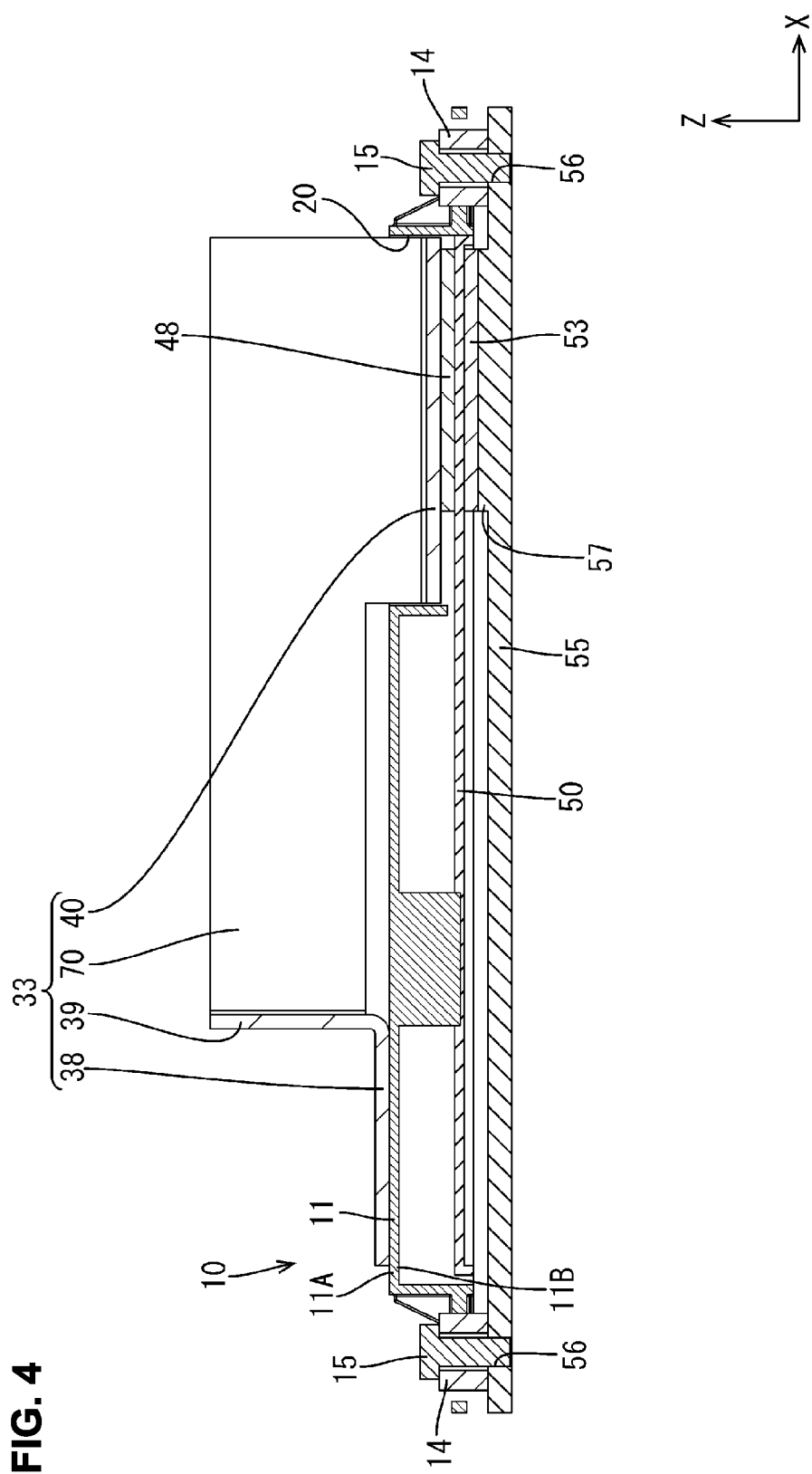
FIG. 4 is a cross-sectional view taken along line IV-IV in FIG. 3.

The base member 11 is formed by injection molding an insulating synthetic resin into a predetermined shape. The synthetic resin constituting the base member 11 may contain a filler such as glass fiber. As shown in FIG. 4, the base member 11 has a flat plate shape in the vertical direction overall, and has an upper surface 11A and a lower surface 11B. In the present embodiment, the outer shape of the base member 11 is substantially rectangular when viewed from above. Note that the outer shape of the base member 11 is not limited to the shape of the present embodiment.

Figure 2:
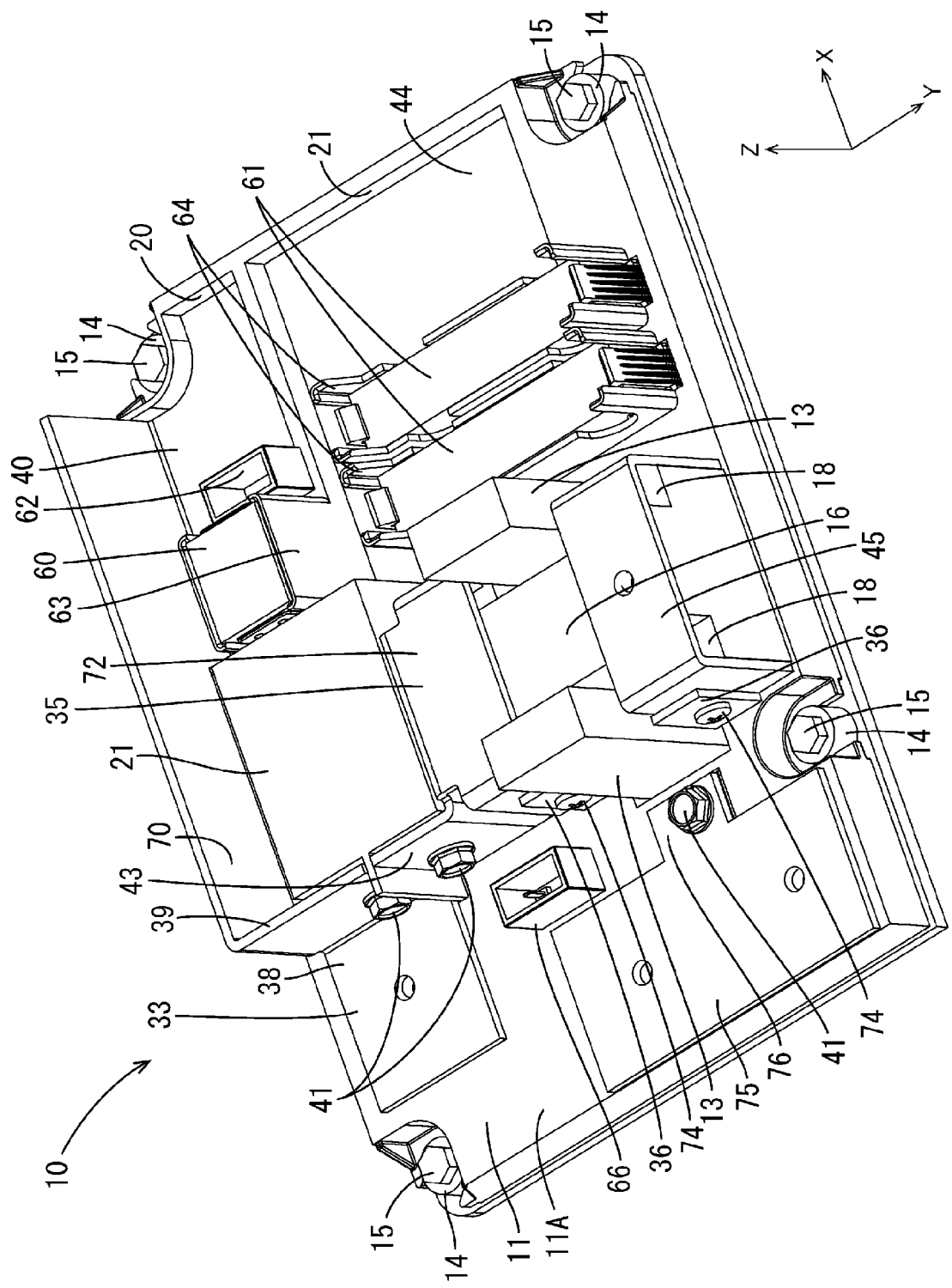
FIG. 2 is a perspective view showing the circuit structure.
Figure 3:
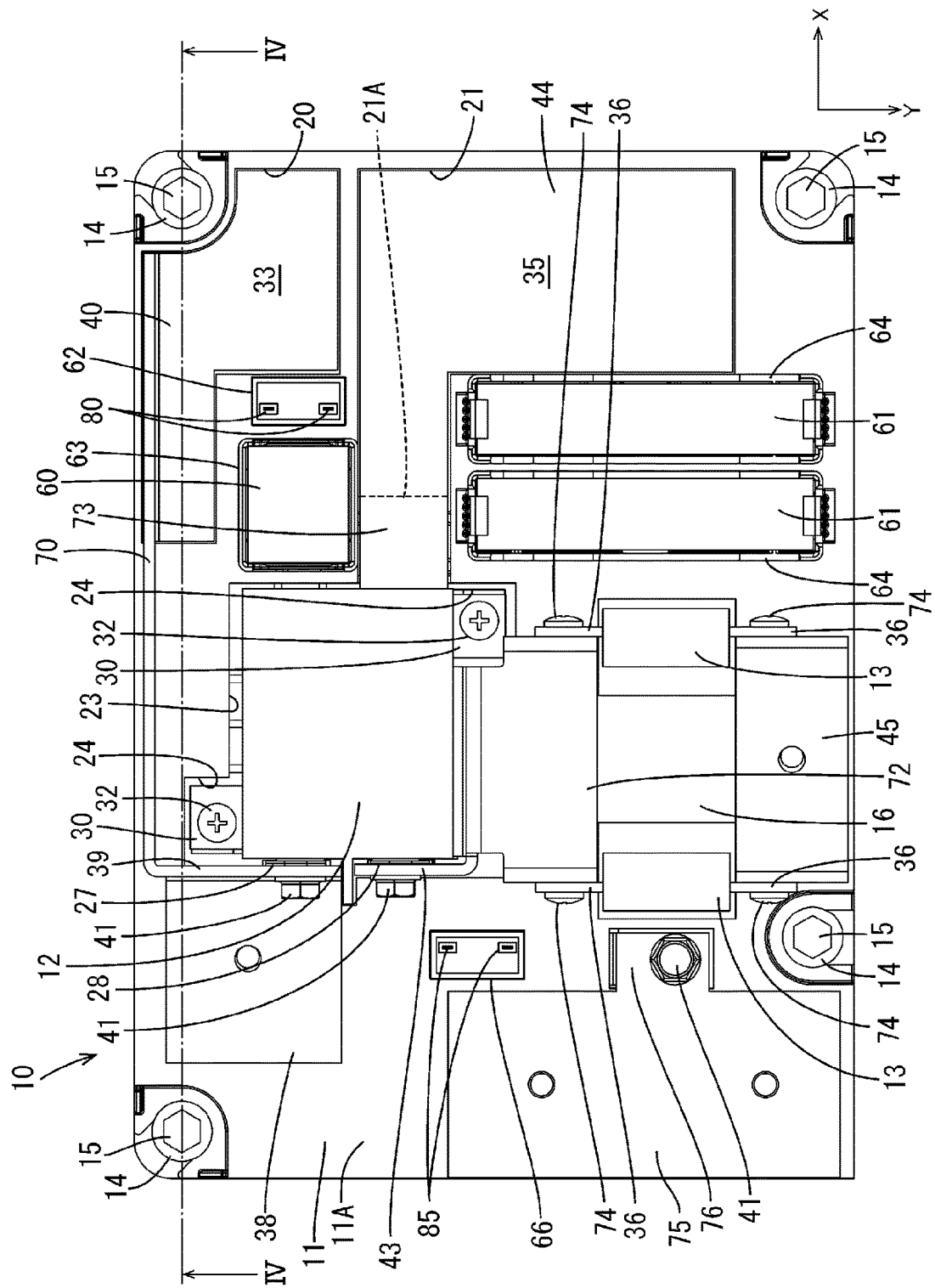
FIG. 3 is a plan view showing the circuit structure.

As shown in FIGS. 2 and 3, cylindrical metal collars 14 are arranged at locations in the right rear corner portion, the left rear corner portion, the left front corner portion, and slightly to the left of the right front corner portion of the base member 11. The collars 14 are arranged on the base member 11 using a known method such as insert molding or press fitting. Bolts 15 are inserted into the collars 14.

Figure 5:
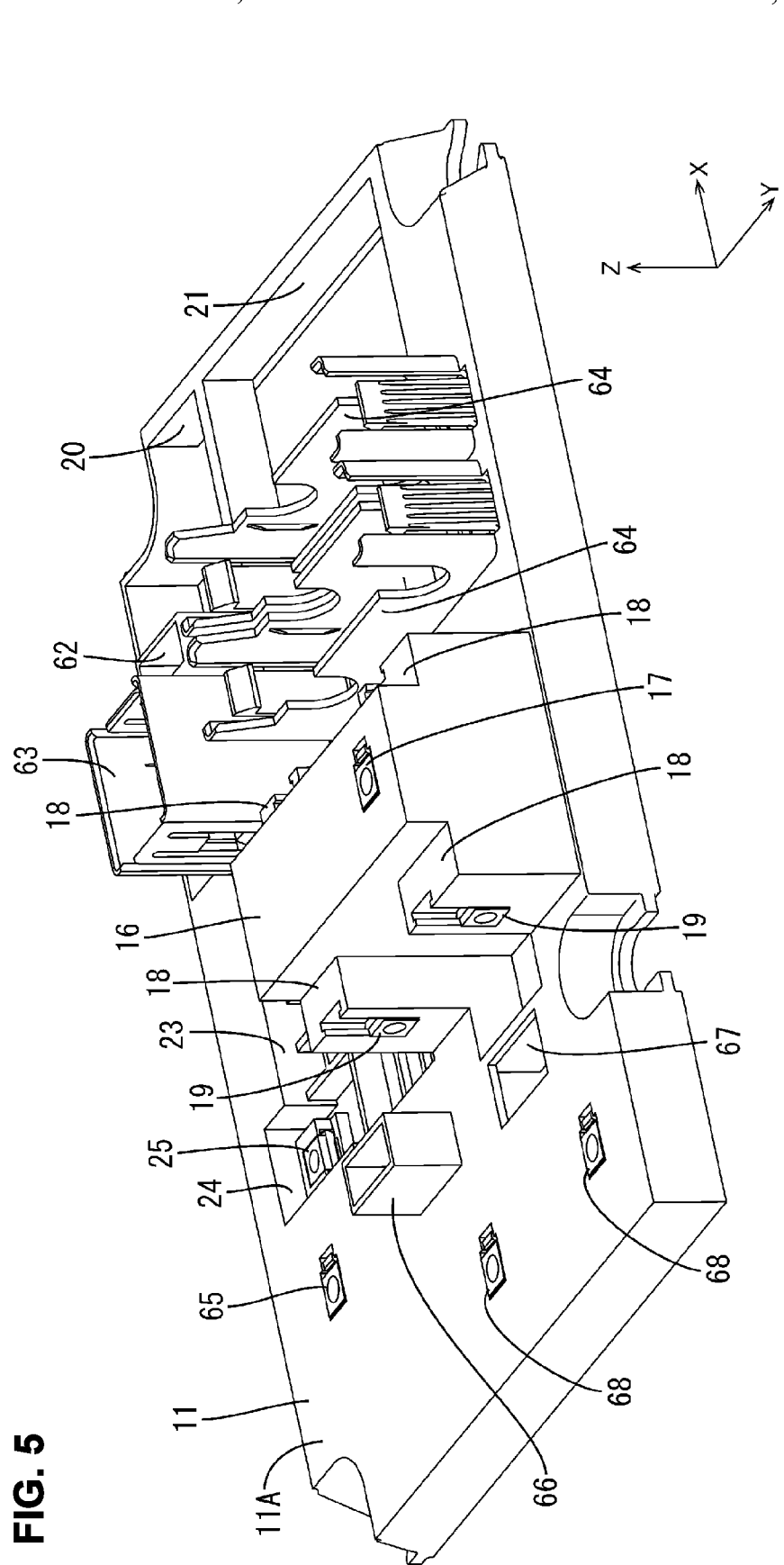
FIG. 5 is a perspective view showing a base member.

As shown in FIG. 5, a main terminal block 16 that projects upward is formed near the center of the base member 11 in the left-right direction, in the forward half region with respect the front-rear direction. A nut 17 is arranged on the upper surface of the main terminal block 16 at a position near the front end portion using a known method such as insert molding or press fitting.

As shown in FIG. 5, two sub terminal blocks 18 arranged with a gap therebetween in the front-rear direction are formed on each of left and right side surfaces of the main terminal block 16 so as to project outward in the left-right direction. The vertical height dimension of the sub terminal blocks 18 is set to be slightly smaller than the vertical height dimension of the main terminal block 16. Nuts 19 are arranged on the left and right side surfaces of the sub terminal block 18 by a known method such as insert molding or press-fitting.

A first through hole 20 (an example of a through hole) that passes through the base member 11 in the vertical direction is formed at a position near the left rear end portion of the base member 11. The base member 11 is also provided with a second through hole 21 (an example of a through hole) that passes through the base member 11 in the vertical direction in front of the first through hole 20.

As shown in FIG. 3, in the base member 11, a square tubular first connector fitting portion 62 that is open upward is provided at a position diagonally forward to the right of the first through hole 20. A square tubular precharge relay attachment portion 63 that is open upward is provided on the right side of the first connector fitting portion 62.

Two precharge resistor attachment portions 64 that are open upward are formed side-by-side in the left-right direction at a position diagonally forward to the right of the second through hole 21 in the base member 11. The two precharge resistor attachment portions 64 are formed with the same shape and size.

A main relay attachment portion 23 (an example of an attachment portion) for attachment of the main relay 12 is provided in the base member 11 by forming a sunken portion at a position that is near the center in the left-right direction and is closer to the rear end portion. The main relay attachment portion 23 has a rectangular shape when viewed from above, and is formed to be slightly larger than the outer shape of the main relay 12. The left front corner and the right rear corner of the main relay attachment portion 23 are recessed portions 24 that are recessed in the front-rear direction. A nut 25 is arranged in each of the recessed portions 24 by a known method such as insert molding or press fitting (see FIG. 1).

As shown in FIG. 5, a nut 65 is arranged at a position near the right rear end portion of the base member 11 by a known method such as insert molding or press fitting.

A second connector fitting portion 66 having a square tubular shape that is open upward is formed in the base member 11 on the right side of the main relay attachment portion 23 and the main terminal block 16.

The base member 11 is provided with a terminal block insertion hole 67 that passes through the base member 11 in the vertical direction at a location in front of the second connector fitting portion 66. The terminal block insertion hole 67 has a rectangular shape when viewed from above.

Two nuts 68 are arranged on the base member 11 with a gap therebetween in the front-rear direction at positions on the right side of the terminal block insertion hole 67 by a known method such as insert molding or press-fitting.

Main Relay 12

The main relay 12 is a so-called mechanical type that includes a contact portion and a coil portion (not shown). As shown in FIGS. 1 and 3, on the right side surface of the main relay 12, a first power terminal 27 provided on the rear side and a second power terminal 28 provided on the front side are arranged side-by-side in the front-rear direction. When an electric current flows through the first power terminal 27 and the second power terminal 28, heat is generated at the contact portions, and the heat is conducted to the first power terminal 27 and the second power terminal 28. The first power terminal 27 and the second power terminal 28 are each provided with a screw hole 29 that extends in the left-right direction (see FIG. 1).

As shown in FIG. 3, fixed protrusion portions 30 that have a rectangular shape when viewed from above respectively project from the left end portion of the front side surface of the main relay 12 and the right end portion of the rear side surface of the main relay 12. An insertion hole 31 is formed in the vertical direction in each of the fixed protrusion portions 30 (see FIG. 1). After the main relay 12 is housed in the main relay attachment portion 23 of the base member 11, screws 32 are inserted into the insertion holes 31, and the screws 32 are screwed into the nut 25 of the recessed portions 24, thus fixing the main relay 12 to the base member 11.

As shown in FIG. 3, a first busbar 33 (an example of a busbar) is fixed to the first power terminal 27 by screwing a screw 41 into the screw hole 29 of the first power terminal 27. Also, a second busbar 35 (an example of a busbar) is fixed to the second power terminal 28 by screwing a screw 41 into the screw hole 29 of the second power terminal 28. The first busbar 33 and the second busbar 35 are formed by pressing a metal plate material into a predetermined shape. The metal constituting the first busbar 33 and the second busbar 35 can be appropriately selected from among various metals that have high thermal conductivity and low electrical resistance, such as copper, a copper alloy, aluminum, or an aluminum alloy.

Precharge Relay 60

As shown in FIGS. 1 to 3, the precharge relay 60 has a rectangular parallelepiped shape smaller than that of the main relay 12, and is a so-called mechanical type of relay that includes a contact portion and a coil portion (not shown). Multiple lead terminals (not shown) project downward from the lower surface of the precharge relay 60.

Precharge Resistor 61

As shown in FIGS. 1 to 3, the precharge resistor 61 is shaped as a rectangular parallelepiped that is elongated in the front-rear direction. Lead terminals 69 project downward from the front end portion and the rear end portion of the precharge resistor 61.

Fuse 13

As shown in FIGS. 1 to 3, each of the fuses 13 has a rectangular parallelepiped shape. Lead terminals 36 are formed so as to project outward in the front-rear direction from the front side surface and the rear side surface of the fuse 13. The lead terminals 36 are made of a metal plate member. The lead terminals 36 are each provided with an insertion hole 37 that passes through in the left-right direction. The lead terminals 36 are configured to be placed on the left and right side surfaces of two sub terminal blocks 18 that are side-by-side in the front-rear direction.

First Busbar 33

Figure 7:
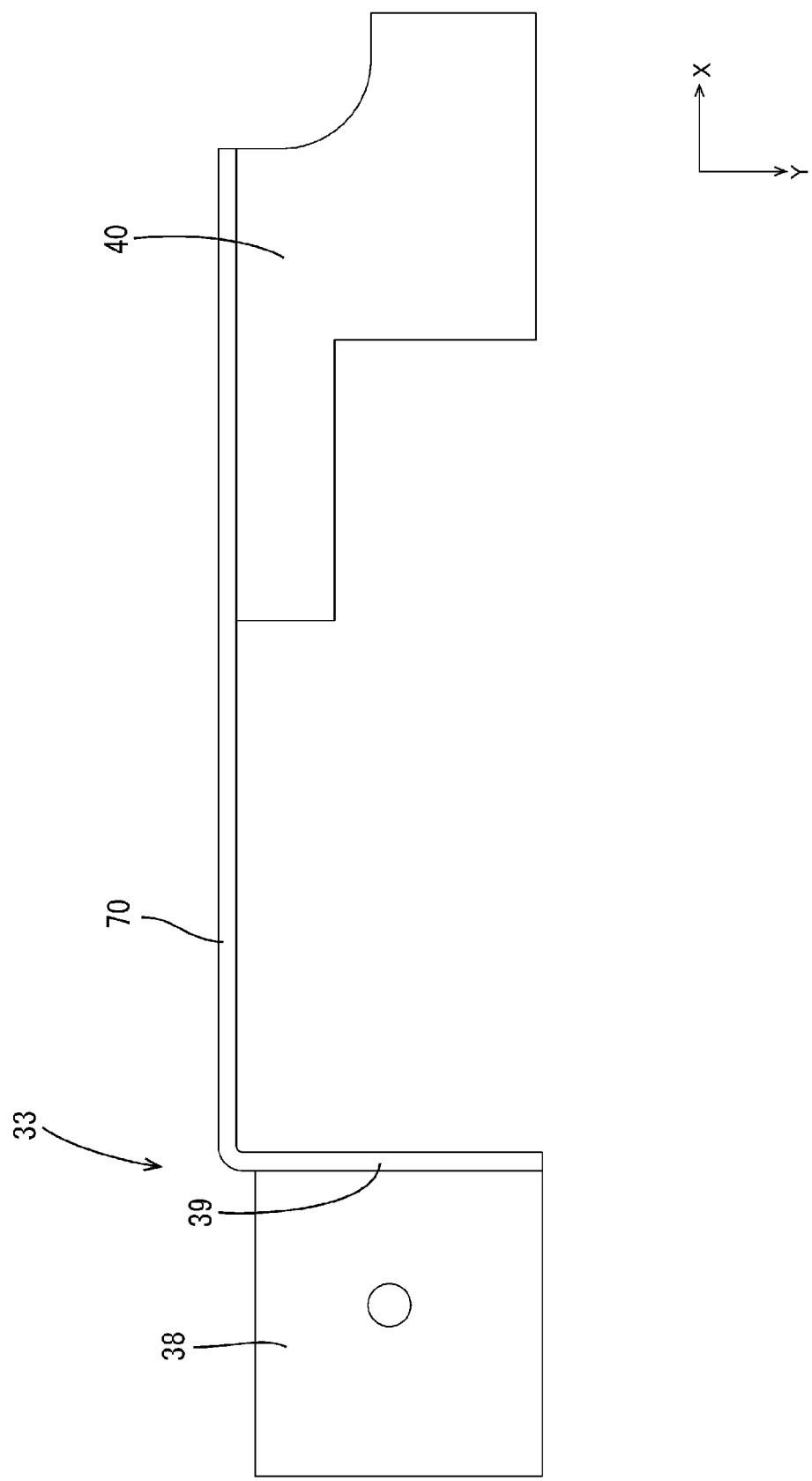
FIG. 7 is a plan view showing a first busbar.

As shown in FIGS. 7 and 8, the first busbar 33 is formed so as to extend in the left-right direction. The first busbar 33 includes an external connection portion 38 configured to be overlaid on a nut, a first electrical connection portion 39 (an example of an electrical connection portion) that extends upward from the left end portion of the external connection portion 38, a first detour portion 70 (an example of a detour portion) that extends to the left from the rear end portion of the first electrical connection portion 39, and a first heat transfer connection portion 40 (an example of a heat transfer connection portion) that extends forward from a portion of the approximately left end portion of the lower end portion of the first detour portion 70.

The external connection portion 38 has a rectangular shape when viewed from above. When the external connection portion 38 and an external circuit terminal (not shown) are overlaid on the upper surface of the nut 65, and a screw (not shown) is then screwed into the nut 65, the external connection portion 38 and the external circuit terminal become electrically connected to each other.

The first electrical connection portion 39 has a substantially rectangular shape when viewed from the left-right direction. The first electrical connection portion 39 is fixed to the first power terminal 27 by being overlaid on the first power terminal 27 from the right side and then screwing a screw 41 into the screw hole 29 of the first power terminal 27. As a result, the first electrical connection portion 39 and the main relay 12 are electrically connected to each other.

The first detour portion 70 has a rectangular shape extending in the left-right direction when viewed from the front-rear direction.

The first heat transfer connection portion 40 is formed with an outer shape that is slightly smaller than the inner surface of the first through hole 20. As a result, the first heat transfer connection portion 40 can be placed in the first through hole 20 from above.

Second Busbar 35

Figure 9:
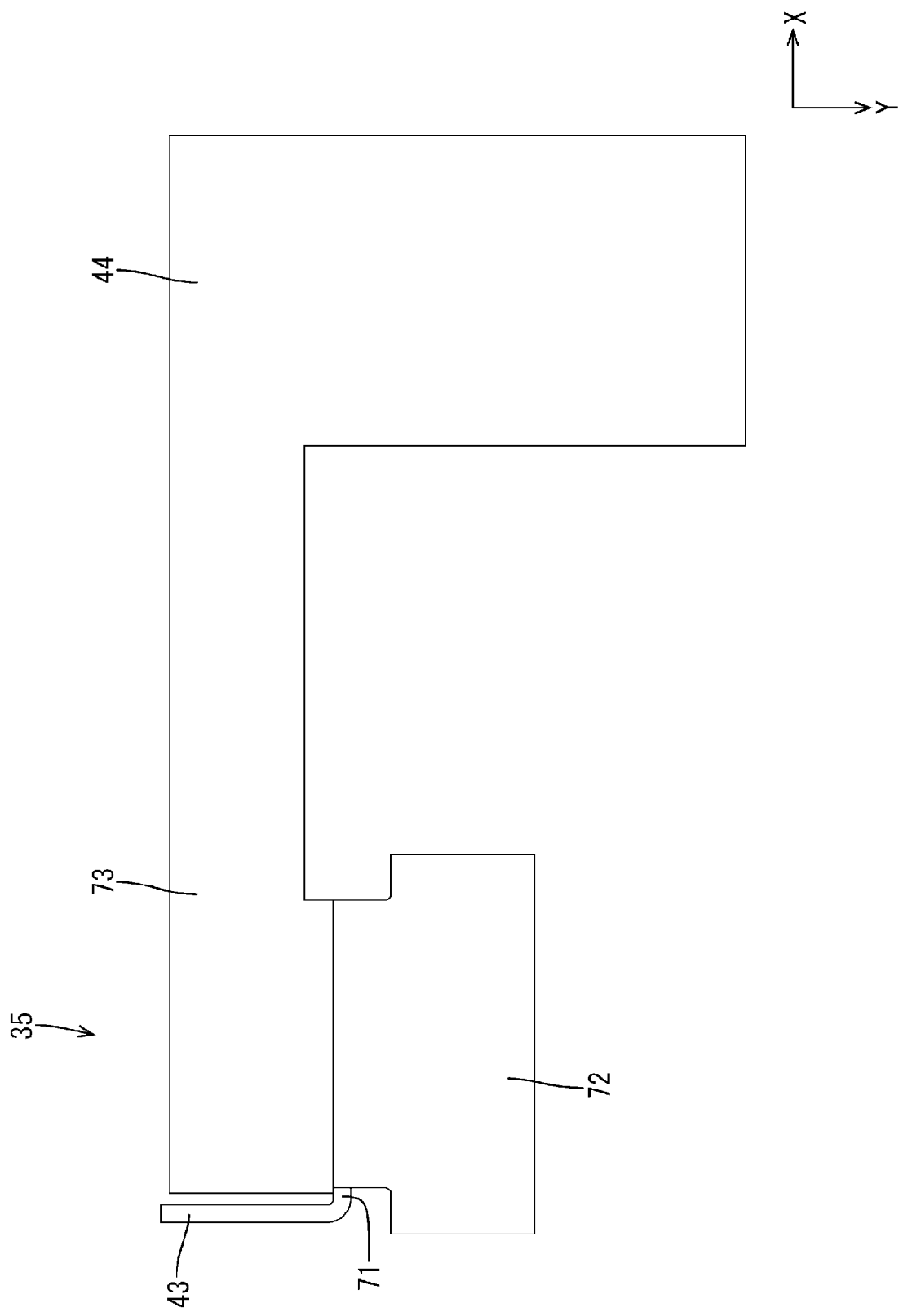
FIG. 9 is a plan view showing a second busbar.
Figure 10:
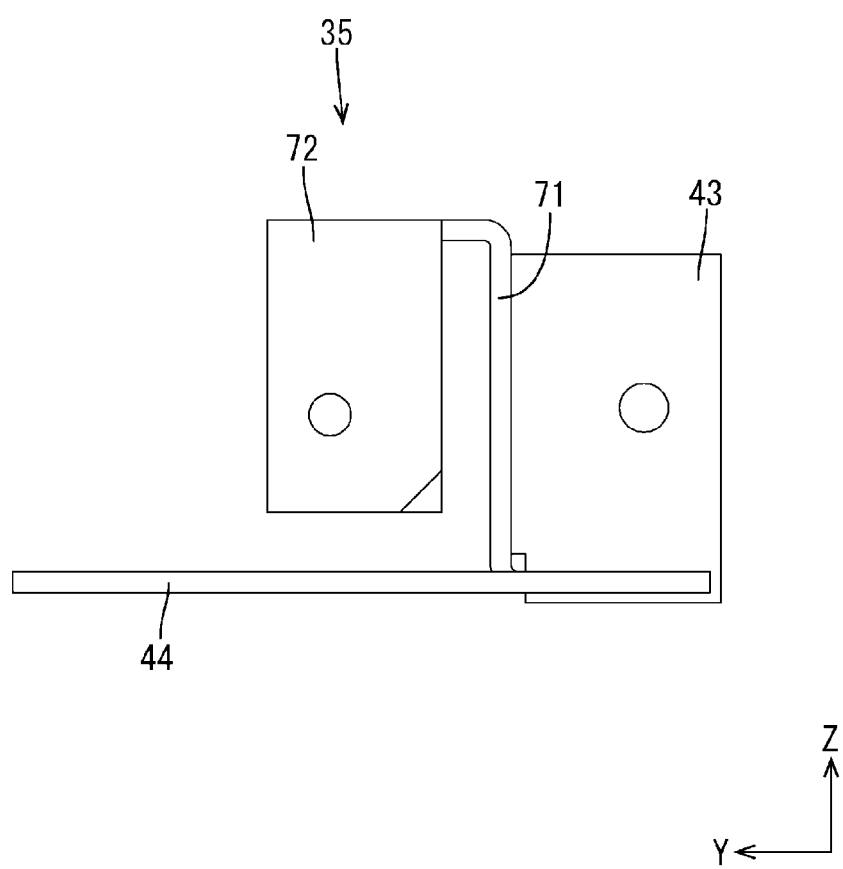
FIG. 10 is a side view showing the second busbar.

As shown in FIGS. 9 and 10, the second busbar 35 includes a second electrical connection portion 43, a lateral detour portion 71 (an example of a detour portion) that extends to the left from the front edge of the second electrical connection portion 43, a portal-shaped fuse connection portion 72 that extends forward from the upper edge of the lateral detour portion 71 and is open downward, a lower detour portion 73 (an example of a detour portion) that bends backward from the lower edge of the lateral detour portion 71 and extends to the left, and a second heat transfer connection portion 44 (an example of a heat transfer connection portion) that is connected to the rear of the lower detour portion 73.

The second electrical connection portion 43 of the second busbar 35 has a rectangular shape that is elongated in the vertical direction when viewed from the left-right direction. The second electrical connection portion 43 is fixed to the second power terminal 28 by being overlaid on the second power terminal 28 from the right side and then screwing a screw 41 into the screw hole 29 of the second power terminal 28. As a result, the second electrical connection portion 43 and the main relay 12 are electrically connected to each other.

As shown in FIGS. 2 and 3, the lateral detour portion 71 is arranged so as to extend along the front side surface of the main relay 12. The lateral detour portion 71 has a rectangular shape when viewed from the front-rear direction. The lateral detour portion 71 is formed such that the length dimension in the left-right direction is slightly shorter than the length dimension of the main relay 12 in the left-right direction.

The downward extending portions of the fuse connection portion 72 are overlaid on the lead terminals 36 that project rearward from the fuses 13 on the left and right side surfaces of the sub terminal blocks 18 that are provided near the rear end portion of the main terminal block 16, and the downward extending portions are fixed by screws 74. As a result, the second busbar 35 and the fuses 13 are electrically connected to each other.

The lower detour portion 73 is arranged so as to extend along the lower surface of the main relay 12. The lower detour portion 73 has a rectangular shape extending in the left-right direction when viewed from above.

The second heat transfer connection portion 44 is formed so as to extend to the left from the left edge of the lower detour portion 73 when viewed from above. As shown in FIG. 3, the lower detour portion 73 and the second heat transfer connection portion 44 are defined such that the portion of the base member 11 that is located inside the second through hole 21 is the second heat transfer connection portion 44. A dashed line 21A indicates the right edge of the second through hole 21, and the region to the left of the dashed line 21A is the second heat transfer connection portion 44. The second heat transfer connection portion 44 is formed such that the outer shape thereof is slightly smaller than the inner surface of the second through hole 21. As a result, the second heat transfer connection portion 44 can be placed in the second through hole 21 from above.

Third Busbar 45

As shown in FIGS. 1 to 3, the third busbar 45 is substantially portal-shaped and is open downward. The third busbar 45 has substantially the same shape as the fuse connection portion 72 of the second busbar 35. The downward extending portions of the third busbar 45 are overlaid on the lead terminals 36 that project forward from the fuses 13 on the left and right side surfaces of the sub terminal blocks 18 that are provided near the front end portion of the main terminal block 16, and the downward extending portions are fixed by screws 74. As a result, the third busbar 45 and the fuse 13 are electrically connected to each other.

The portion of the third busbar 45 that extends in the left-right direction is overlaid on the nut 17 of the main terminal block 16. The third busbar 45 and an external circuit terminal (not shown) are overlaid on the upper surface of the nut 17, and a screw (not shown) is screwed into the nut 17, and thus the third busbar 45 and the external circuit terminal are electrically connected to each other.

Fourth Busbar 75

As shown in FIGS. 1 to 3, a fourth busbar 75 includes a rectangular main body that extends in the front-rear direction and a connecting projection portion 76 that projects to the left from the left edge of the main body. When the main body of the fourth busbar 75 and an external circuit terminal (not shown) are overlaid on the upper surface of the two nuts 68 (see FIG. 5) arranged on the base member 11, and screws (not shown) are screwed into the nuts 68, the fourth busbar 75 becomes electrically connected to the external circuit terminal.

Also, the connecting projection portion 76 is overlaid on the upper surface of a lower terminal block 77 that has been inserted into the terminal block insertion hole 67 (see FIGS. 5 and 6 as well), and a screw (not shown) is screwed into a nut (not shown), and thus the connecting projection portion 76 becomes electrically connected to the lower terminal block 77.

Upper First Heat Transfer Sheet 48 and Upper Second Heat Transfer Sheet 49

As shown in FIG. 4, the upper first heat transfer sheet 48 (an example of a heat transfer sheet) is stacked below the first heat transfer connection portion 40. The upper first heat transfer sheet 48 has a flat sheet shape in the vertical direction, and is made of a synthetic resin that has a higher thermal conductivity than air. The shape of the upper first heat transfer sheet 48 is set to be substantially the same as the shape of the first heat transfer connection portion 40. The upper first heat transfer sheet 48 is elastically deformable, and the thickness and dimensions thereof can be changed according to the force applied in the vertical direction.

As shown in FIG. 4, the upper second heat transfer sheet 49 (an example of a heat transfer sheet) is stacked below the second heat transfer connection portion 44. The shape of the upper second heat transfer sheet 49 is set to be substantially the same as the shape of the second heat transfer connection portion 44. The upper second heat transfer sheet 49 has a flat sheet shape in the vertical direction, and is made of a synthetic resin that has a higher thermal conductivity than air. The second heat transfer sheet is elastically deformable, and the thickness and dimensions thereof can be changed according to the force applied in the vertical direction. The thickness dimension of the upper first heat transfer sheet 48 and the thickness dimension of the upper second heat transfer sheet 49 are set to be substantially the same. The term "substantially the same" includes the case of being the same, and the case of being considered to be almost the same even if they are not the same.

Insulating Plate 50

As shown in FIGS. 1 and 4, an insulating plate 50 made of an insulating synthetic resin is arranged below the base member 11. The outer shape of the insulating plate 50 generally conforms to the outer shape of the base member 11, and is rectangular when viewed from above. Portions of the insulating plate 50, including the right rear corner portion, the left rear corner portion, the left front corner portion, and a position somewhat to the left of the right front corner portion have been cut out to avoid interfering with the collar 14.

Figure 6:
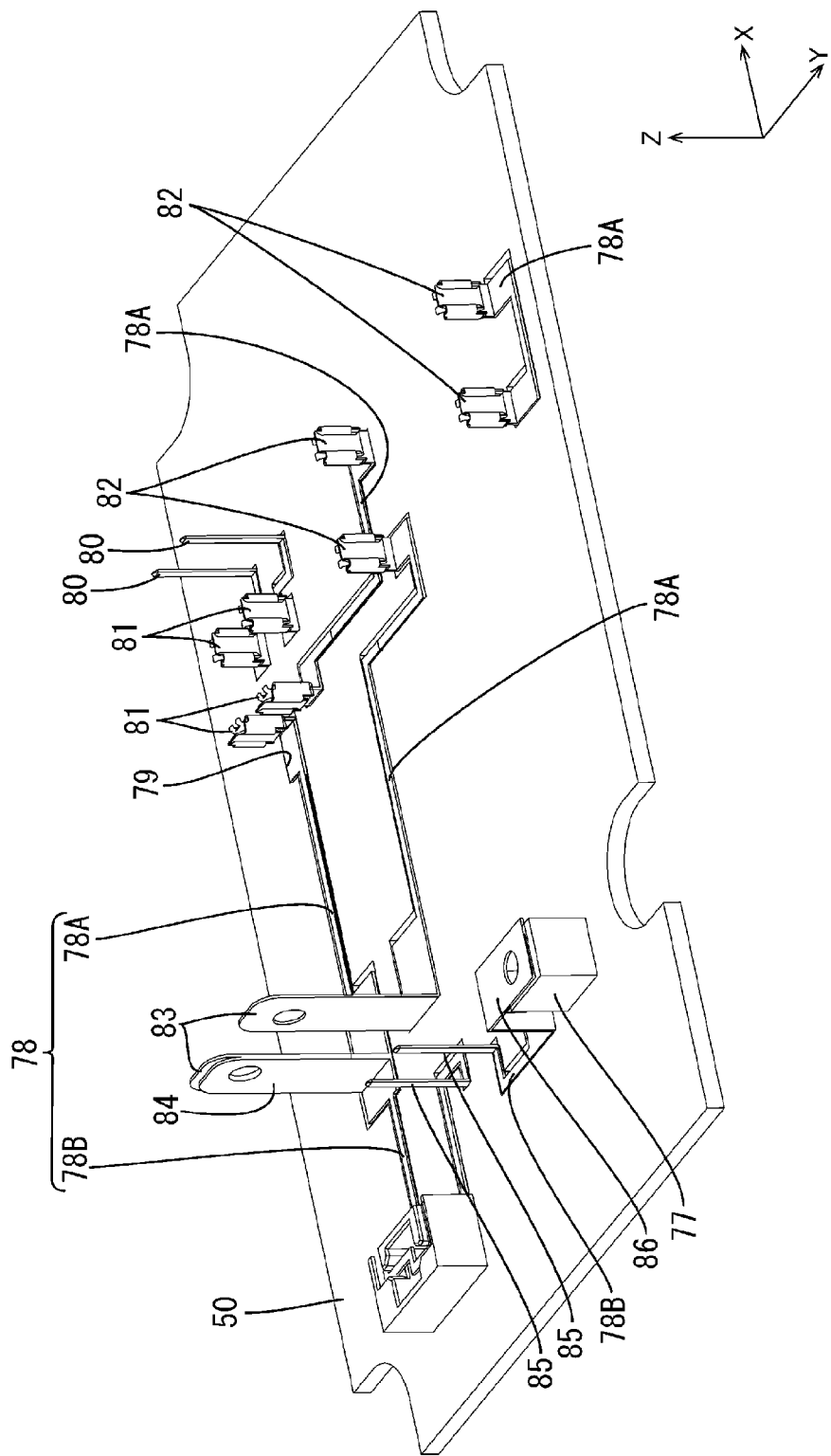
FIG. 6 is a perspective view showing an insulating plate.

As shown in FIG. 6, a sub busbar accommodating portion 79 for accommodating multiple sub busbars 78 is arranged on the upper surface of the insulating plate 50, and is shaped as a groove that is recessed downward. The sub busbars 78 includes a precharge busbar 78A that constitutes a precharge circuit by being connected to the precharge relay 60 or the precharge resistor 61, and a bypass busbar 78B that is branched from the first power terminal 27 of the main relay 12.

The precharge busbar 78A includes male tabs 80 that project upward and are to be arranged in the first connector fitting portion 62, precharge relay connection portions 81 that project upward and are for connection to lead terminals (not shown) of the precharge relay 60, precharge resistor connection portions 82 that project upward and are for connection to the lead terminals 69 of the precharge resistor 61, and power terminal connection portions 83 that project upward and are for connection to the first power terminal 27 and the second power terminal 28 of the main relay 12. At least a portion of the precharge busbar 78A is located below the main relay 12.

The bypass busbar 78B includes a power terminal connection portion 84 that projects upward and is for connection to the first power terminal 27 of the main relay 12, male tabs 85 that project upward and are to be arranged in the second connector fitting portion 66, and an external connection portion 86 that is overlaid on the upper surface of the lower terminal block 77. The external connection portion 86 is electrically connected to an external circuit via the fourth busbar 75.

The lower terminal block 77 that projects upward is provided on the upper surface of the insulating plate 50 at a position toward to the right front end portion. The lower terminal block 77 is shaped as a polygonal column. The height dimension of the lower terminal block 77 is set such that when the insulating plate 50 and the base member 11 are assembled together, the upper surface of the external connection portion 86 placed on the lower terminal block 77 is flush with the upper surface of the base member 11.

Lower First Heat Transfer Sheet 53 and Lower Second Heat Transfer Sheet 54

As shown in FIGS. 1 and 4, a lower first heat transfer sheet 53 (an example of a heat transfer sheet) is stacked below the lower surface of the insulating plate 50 at a position corresponding to the upper first heat transfer sheet 48, and a lower second heat transfer sheet 54 (an example of a heat transfer sheet) is stacked at a position corresponding to the upper second heat transfer sheet 49. The lower first heat transfer sheet 53 is made of the same material as the upper first heat transfer sheet 48 and is formed in the same shape. Also, the lower second heat transfer sheet 54 is made of the same material as the upper second heat transfer sheet 49 and is formed in the same shape. Descriptions will not be given for portions of the lower first heat transfer sheet 53 and the lower second heat transfer sheet 54 that are the same as in the upper first heat transfer sheet 48 and the upper second heat transfer sheet 49.

Heat Dissipation Member 55

As shown in FIGS. 1 and 4, a metal heat dissipation member 55 is arranged below the insulating plate 50. The metal constituting the heat dissipation member 55 can be selected as necessary, and examples include aluminum, an aluminum alloy, and stainless steel. In the present embodiment, the heat dissipation member 55 is made of aluminum or an aluminum alloy. The heat dissipation member 55 can be formed into a predetermined shape by a known method such as casting, cutting, pressing, or the like. The heat dissipation member 55 is formed such that outer shape is substantially the same as the outer shape of the base member 11, and has a substantially rectangular shape. Screw holes 56 that pass through in the vertical direction are formed in the heat dissipation member 55 in the right rear corner portion, the left rear corner portion, the left front corner portion, and a position somewhat to the left of the right front corner portion, and bolts 15 are screwed therein. By screwing the bolts 15 into the screw holes 56, the base member 11 and the heat dissipation member 55 are integrally fixed together.

First Platform Portion 57

As shown in FIGS. 1 and 4, a first platform portion 57 (an example of a platform portion) on which the lower first heat transfer sheet 53 is to be placed is formed so as to project upward from the upper surface of the heat dissipation member 55 at a position below the lower first heat transfer sheet 53. When viewed from above, the shape of the first platform portion 57 is substantially the same as the outer shape of the lower first heat transfer sheet 53. The term "substantially the same" includes the case where the shape of the first platform portion 57 and the shape of the lower first heat transfer sheet 53 are the same, and also includes the case where they are recognized to be substantially the same even if they are not the same.

Second Platform Portion 58

As shown in FIG. 1, a second platform portion 58 on which the lower second heat transfer sheet 54 is to be placed is formed so as to project upward from the upper surface of the heat dissipation member 55 at a position below the lower second heat transfer sheet 54. When viewed from above, the shape of the second platform portion 58 is substantially the same as the outer shape of the lower second heat transfer sheet 54. The term "substantially the same" includes the case where the shape of the second platform portion 58 and the shape of the lower second heat transfer sheet 54 are the same, and also includes the case where they are recognized to be substantially the same even if they are not the same.

Precharge Circuit

A precharge circuit is connected in parallel to the main relay 12. In the precharge circuit, the precharge relay 60 and the precharge resistor 61 are connected in series via the precharge busbar 78A. The precharge relay 60 is turned on and off by a signal transmitted from the outside via a connector (not shown) fitted to the first connector fitting portion 62.

If the main relay 12 is turned on after the precharge relay 60 is turned on, the flow of an inrush current through the main relay 12 is suppressed. It is desirable that the precharge circuit is arranged in the vicinity of the main relay 12. In the present embodiment, the precharge relay 60 and the precharge resistor 61 are arranged in the vicinity of the left side of the main relay 12. Also, at least a portion of the precharge busbar 78A is located below the main relay 12.

Bypass Circuit

A bypass circuit is connected in parallel to a circuit for output from the main relay 12 to the outside, and the state (e.g., output voltage) of the first power terminal 27 of the main relay 12 is monitored via a connector (not shown) fitted to the second connector fitting portion 66. Therefore, it is desirable that the bypass circuit is arranged in the vicinity of the main relay 12. In the present embodiment, the bypass busbar 78B constituting the bypass circuit is arranged in the vicinity of the right side of the main relay 12.

Circuit Structure 10 Assembly Process

Next, an example of a process for assembling the circuit structure 10 will be described. The process for assembling the circuit structure 10 is not limited to the following description.

The base member 11 is formed into a predetermined shape by injection molding of a synthetic resin material. The nut 17, collar 14, and the like are then attached to the base member 11.

The fuses 13 and the main relay 12 are placed on the base member 11 from above. The main relay 12 is fixed to the base member 11 with the screws 32. Next, the first busbar 33, the second busbar 35, and the third busbar 45 are attached at predetermined positions on the base member 11 from above. The fuses 13, the first busbar 33, the second busbar 35, and the third busbar 45 are fixed to the base member 11 and the main relay 12 by the screws 41 and 74.

The upper first heat transfer sheet 48, the upper second heat transfer sheet 49, the lower first heat transfer sheet 53, and the lower second heat transfer sheet 54 are cut into a predetermined shape by a known method such as using a Thomson die.

The insulating plate 50 is formed into a predetermined shape by injection molding of a synthetic resin material. The sub busbar 78 is attached to the insulating plate 50.

The heat dissipation member 55 is formed by forming aluminum or an aluminum alloy into a predetermined shape by a known method such as aluminum die casting. The lower first heat transfer sheet 53 is placed on the upper surface of the first platform portion 57 of the heat dissipation member 55, and the lower second heat transfer sheet 54 is placed on the upper surface of the second platform portion 58. The insulating plate 50 is placed on the heat dissipation member 55 on which the lower first heat transfer sheet 53 and the lower second heat transfer sheet 54 have been placed.

The upper first heat transfer sheet 48 and the upper second heat transfer sheet 49 are overlaid on the upper surface of the insulating plate 50. Next, the base member 11 is overlaid on the insulating plate 50. At this time, the first heat transfer connection portion 40 is overlaid on the upper first heat transfer sheet 48, and the second heat transfer connection portion 44 is overlaid on the upper second heat transfer sheet 49.

Figure 11:
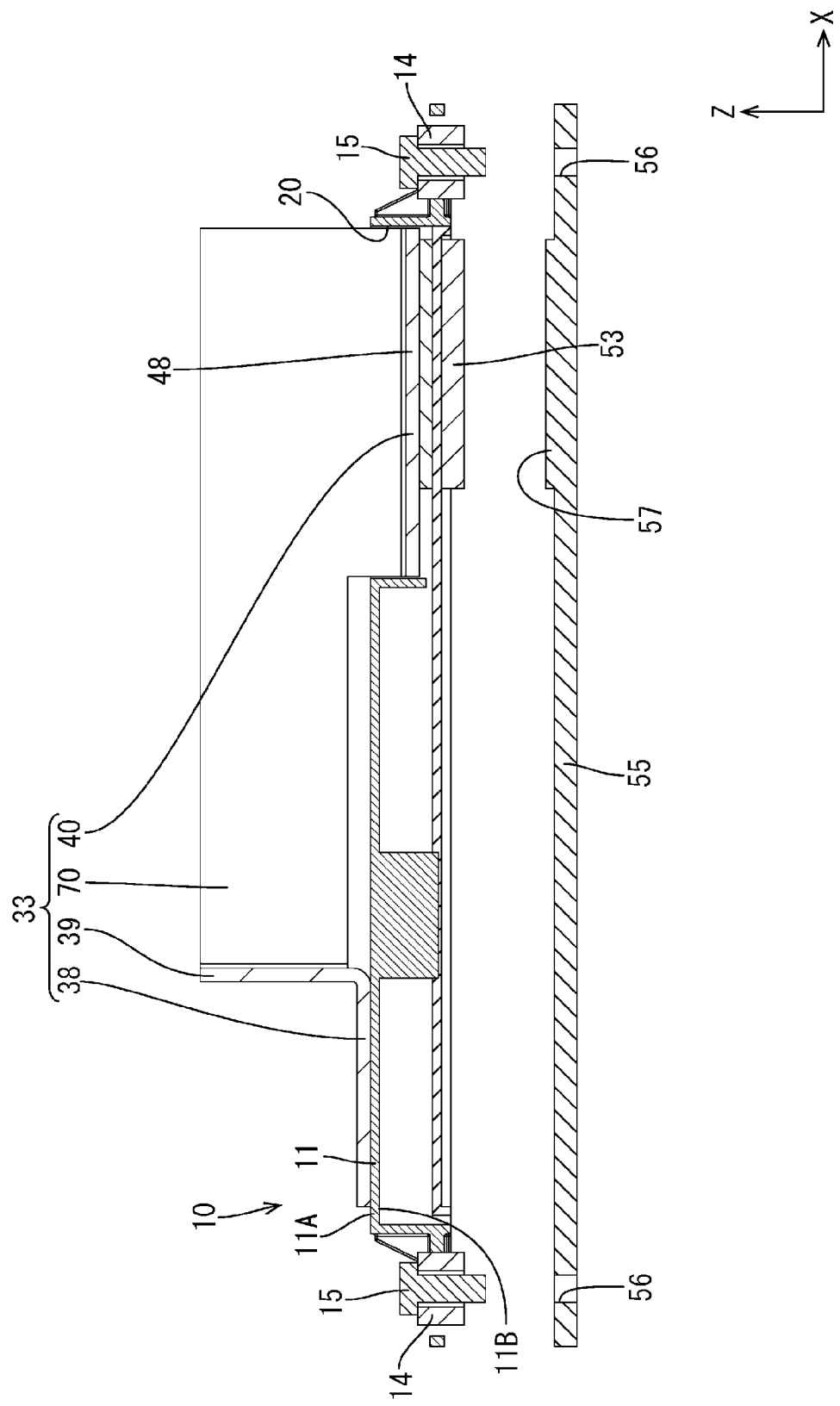
FIG. 11 is a cross-sectional view showing a circuit structure assembly process.

Before the bolts 15 are screwed into the screw holes 29 of the heat dissipation member 55, the upper first heat transfer sheet 48, the upper second heat transfer sheet 49, the lower first heat transfer sheet 53, and the lower second heat transfer sheet 54 are in their natural state (see FIG. 11).

Figure 12:
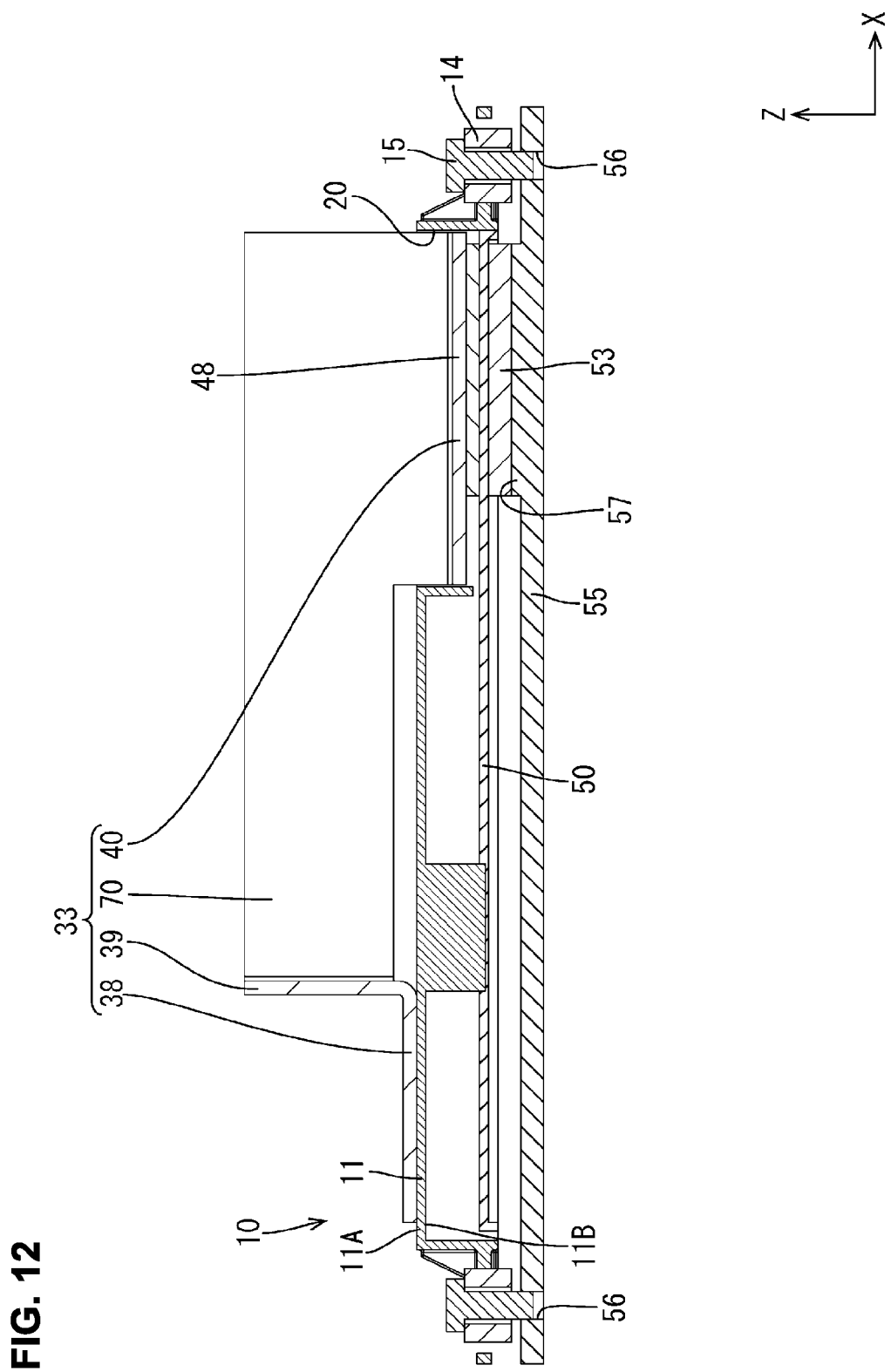
FIG. 12 a cross-sectional view showing the circuit structure assembling process, and shows a state in which bolts are being screwed into screw holes.

As shown in FIGS. 11 and 12, the bolts 15 are screwed into the screw holes 29 of the heat dissipation member 55. Accordingly, the base member 11 is fixed to the heat dissipation member 55. As a result, the upper first heat transfer sheet 48, the upper second heat transfer sheet 49, the lower first heat transfer sheet 53, and the lower second heat transfer sheet 54 are subjected to force in the direction of being compressed in the vertical direction. Accordingly, the upper first heat transfer sheet 48, the upper second heat transfer sheet 49, the lower first heat transfer sheet 53, and the lower second heat transfer sheet 54 elastically deform in the vertical direction. FIG. 12 shows the upper first heat transfer sheet 48 compressed in the vertical direction and the lower first heat transfer sheet 53 in the natural state.

When the bolts 15 are screwed into the screw holes 56, the upper first heat transfer sheet 48, the upper second heat transfer sheet 49, the lower first heat transfer sheet 53, and the lower second heat transfer sheet 54 are compressed in the vertical direction. Accordingly, the upper first heat transfer sheet 48 is in close contact with the first heat transfer connection portion 40 and the insulating plate 50, the upper second heat transfer sheet 49 is in close contact with the second heat transfer connection portion 44 and the insulating plate 50, the lower first heat transfer sheet 53 is in close contact with the insulating plate 50 and the first platform portion 57, and the lower second heat transfer sheet 54 is in close contact with the insulating plate 50 and the second platform portion 58.

Accordingly, the main relay 12 and the heat dissipation member 55 are thermally connected by the first busbar 33, the second busbar 35, the upper first heat transfer sheet 48, the upper second heat transfer sheet 49, the insulating plate 50, the lower first heat transfer sheet 53, and the lower second heat transfer sheet 54 (see FIG. 4).

The fourth busbar 75 is fixed to the base member 11 with the screws 41. The precharge relay 60 is attached to the precharge relay attachment portion 63 from above. The precharge resistor 61 is attached to the precharge resistor attachment portion 64 from above. The circuit structure 10 is completed as described above.

Next, actions and effects of the present embodiment will be described. According to the present embodiment, heat generated at the contact portion of the main relay 12 when receiving electrical power is transferred to the first power terminal 27 and the second power terminal 28. The heat that reaches the first power terminal 27 is transferred to the first electrical connection portion 39 of the first busbar 33, and passes through the first busbar 33 to the first heat transfer connection portion 40 via the first detour portion 70. The heat that reaches the first heat transfer connection portion 40 is transferred to the insulating plate 50 via the upper first heat transfer sheet 48, and further to the heat dissipation member 55 via the lower first heat transfer sheet 53. Similarly, the heat that reaches the second power terminal 28 is also transferred to the second electrical connection portion 43 of the second busbar 35, the lateral detour portion 71, the lower detour portion 73, the second heat transfer connection portion 44, the upper second heat transfer sheet 49, the insulating plate 50, the lower second heat transfer sheet 54, and the heat dissipation member 55. Accordingly, heat generated by the main relay 12 efficiently moves to the heat dissipation member 55 and is dissipated from the heat dissipation member 55 to the outside. As a result, the heat dissipation of the circuit structure 10 is improved.

Also, according to the above configuration, the first detour portion 70 that connects the first electrical connection portion 39 and the first heat transfer connection portion 40 can have a desired shape, and the lateral detour portion 71 and the lower detour portion 73 that connect the second electrical connection portion 43 and the second heat transfer connection portion 44 can have a desired shape, and therefore the first heat transfer connection portion 40 and the second heat transfer connection portion 44 can be provided at positions separated from the main relay 12. Accordingly, the heat dissipation of the circuit structure 10 can be improved even if the first through hole 20 and the second through hole 21 cannot be provided in the base member 11 in the vicinity of the main relay 12.

Also, the first busbar 33 and the second busbar 35 that are electrically connected to the main relay 12 are reliably electrically insulated the metal heat dissipation member 55 by the insulating upper first heat transfer sheet 48 and upper second heat transfer sheet 49, the insulating plate 50, the lower first heat transfer sheet 53, and the lower second heat transfer sheet 54. Accordingly, it is possible to improve the heat dissipation of the circuit structure 10 while maintaining electrical insulation.

Also, according to the present embodiment, the upper first heat transfer sheet 48, the upper second heat transfer sheet 49, the lower first heat transfer sheet 53, and the lower second heat transfer sheet 54 are made of an elastically deformable material.

When electrical power is supplied, heat generated from the main relay 12 causes the first busbar 33, the second busbar 35, the insulating plate 50, and the heat dissipation member 55 to expand. Since the coefficient of thermal expansion of the metal and the coefficient of thermal expansion of the insulating material are different, there is a risk that a gap may be formed between the first busbar 33 and the second busbar 35, the insulating plate 50, and the heat dissipation member 55. Since the thermal conductivity of air is very low, there is a concern that the heat dissipation of the circuit structure 10 will decrease if a gap is formed. According to the above configuration, the upper first heat transfer sheet 48, the upper second heat transfer sheet 49, the lower first heat transfer sheet 53, and the lower second heat transfer sheet 54 can undergo elastic deformation and elastic restoration, and therefore it is possible to suppress the formation of a gap between the first busbar 33 and the second busbar the 35, the insulating plate 50, and the heat dissipation member 55 in at least the portions where the upper first heat transfer sheet 48, the upper second heat transfer sheet 49, the lower first heat transfer sheet 53, and the lower second heat transfer sheet 54 are provided. As a result, the heat dissipation of the circuit structure 10 can be improved.

Also, a switching sound generated at the contact portion when the main relay 12 is turned on or off can be absorbed due to elastic deformation of the upper first heat transfer sheet 48, the upper second heat transfer sheet 49, the lower first heat transfer sheet 53, and the lower second heat transfer sheet 54. Accordingly, the quietness of the circuit structure 10 can be improved.

Also, vibration transmitted from the vehicle to the main relay 12 can be absorbed due to elastic deformation of the upper first heat transfer sheet 48, the upper second heat transfer sheet 49, the lower first heat transfer sheet 53, and the lower second heat transfer sheet 54. Since the main relay 12 for electric power connected to the power source of the vehicle is relatively large, the technology described in the present specification is particularly effective.

Also, tolerance of the base member 11, the insulating plate 50, and the heat dissipation member 55 can be handled due to elastic deformation or elastic restoration of the upper first heat transfer sheet 48, the upper second heat transfer sheet 49, the lower first heat transfer sheet 53, and the lower second heat transfer sheet 54.

Also, according to the present embodiment, the heat dissipation member 55 has the first platform portion 57 and the second platform portion 58 that project toward the insulating plate 50 at positions corresponding to the insulating plate 50.

According to the above configuration, the insulating plate 50 can be pressed toward the first heat transfer connection portion 40 by the first platform portion 57, and can be pressed toward the second heat transfer connection portion 44 by the second platform portion 58. Accordingly, it is possible to suppress the formation of a gap between the insulating plate 50 and the first heat transfer connection portion 40 and second heat transfer connection portion 44. As a result, the heat dissipation of the circuit structure 10 can be improved.

According to the present embodiment, the insulating plate 50 is made of an insulating synthetic resin material.

According to the above configuration, the shape of the insulating plate 50 can be easily set so as to correspond to the shape of the first heat transfer connection portion 40 and the second heat transfer connection portion 44. Accordingly, heat can be efficiently transferred from the first heat transfer connection portion 40 and the second heat transfer connection portion 44 to the insulating plate 50, and thus the heat dissipation of the circuit structure 10 can be improved.

Also, according to the present embodiment, a sub busbar 78 different from the first busbar 33 and the second busbar 35 is arranged on the insulating plate 50 at a position corresponding to the main relay 12.

According to the above configuration, a circuit different from the first busbar 33 and the second busbar 35 can be formed by the sub busbar 78 at a position corresponding to the main relay 12 in the insulating plate 50, thus making it possible to improve the degree of freedom.

Also, the sub busbar 78 includes the precharge busbar 78A that constitutes a precharge circuit connected in parallel to the main relay 12.

According to the above configuration, the precharge circuit of the main relay 12 can be formed on the insulating plate 50 at a position corresponding to the main relay 12, and thus the wiring density of the circuit structure 10 can be improved.

Other Embodiments

The technology described in the present specification is not limited to the embodiments described above and in the drawings, and for example, the following embodiments are also included in the technical scope of the technology described in the present specification.

(1) The heat transfer sheet may be arranged only between the heat transfer connection portion and the insulating plate, or may be arranged only between the insulating plate and the heat dissipation member.

(2) In the present embodiment, the heat dissipation member is configured to have a platform portion, but the present invention is not limited to this, and the platform portion may be omitted. Also, a sunken portion may be formed in a portion of the heat dissipation member on which the heat transfer sheet is to be placed.

(3) In the present embodiment, busbars are connected to the power terminals of the main relay, but the present invention is not limited to this, and a busbar may be connected to a coil terminal of the main relay.

(4) The heat transfer sheets may have adhesiveness or may not have adhesiveness. If the heat transfer sheets have adhesiveness, it is possible to further improve the adhesion between the busbars and the insulating plate or the adhesion between the insulating plate and the heat dissipation member.

(5) The shape of the heat dissipation member is not limited to being a plate shape, and may be, for example, a box shape that is open upward and can accommodate the base member. Also, the heat dissipation member may be a bracket for attaching the circuit structure to another member.

(6) The heat generating component is not limited to being the mechanical relay, and may be any electronic component such as a semiconductor relay, a capacitor, or a diode.

(7) The shape of the heat transfer connection portion provided on a busbar can be any shape as needed. The shape of each heat transfer sheet is arbitrary and may be the same as or different from the shape of the heat transfer connection portion. The shape of the platform portion provided on a heat dissipation member is arbitrary and may be the same as or different from the shape of the heat transfer sheet.

(8) The sub busbar 78 may include a circuit different from the precharge circuit and the bypass circuit.

(9) In the present embodiment, the sub busbar 78 is arranged on the insulating plate 50, but the present invention is not limited to this, and the insulating plate 50 may not be provided with the sub busbar 78. Also, a conductive path may be formed on the insulating plate 50 by a printed wiring technique.

LIST OF REFERENCE NUMERALS

10 Circuit structure
11 Base member
11A Upper surface
11B Lower surface
12 Main relay (example of heat generating component)
20 First through hole (example of through hole)
21 Second through hole (example of through hole)
27 First power terminal (example of power terminal)
28 Second power terminal (example of power terminal)
33 First busbar (example of busbar)
35 Second busbar (example of busbar)
39 First electrical connection portion (example of electrical connection portion)
40 First heat transfer connection portion (example of heat transfer connection portion)
43 Second electrical connection portion (example of electrical connection portion)
44 Second heat transfer connection portion (example of heat transfer connection portion)
48 Upper first heat transfer sheet (example of heat transfer sheet)
49 Upper second heat transfer sheet (example of heat transfer sheet)
50 Insulating plate
53 Lower first heat transfer sheet (example of heat transfer sheet)
54 Lower second heat transfer sheet (example of heat transfer sheet)
55 Heat dissipation member
57 First platform portion (example of platform portion)
58 Second platform portion (example of platform portion)
70 First detour portion (example of detour portion)
71 Lateral detour portion (example of detour portion)
73 Lower detour portion (example of detour portion)
78 Sub busbar
78A Precharge busbar

The invention claimed is:

1. A circuit structure comprising:
a heat generating component that generates heat when electrical power is supplied;
a busbar including an electrical connection portion electrically connected to the heat generating component, a heat transfer connection portion provided at a different position from the electrical connection portion, and a detour portion that connects the electrical connection portion and the heat transfer connection portion to each other;
a base member that has an upper surface on which the heat generating component is arranged and a lower surface, and includes a through hole that passes through the upper surface and the lower surface and accommodates the heat transfer connection portion;
an insulating plate that is made of an insulating material and is arranged below the heat transfer connection portion; and
a heat dissipation member that is made of a metal and is arranged below the insulating plate,
wherein the heat generating component is a relay, the relay has a power terminal to which electrical power is supplied, and the electrical connection portion of the busbar is connected to the power terminal,
a sub busbar different from the busbar is arranged on the insulating plate at a position corresponding to the heat generating component,
the sub busbar includes a precharge busbar that constitutes a precharge circuit connected in parallel to the relay, and
in the precharge circuit, a precharge relay and a precharge resistor are connected in series via the precharge busbar.

2. The circuit structure according to claim 1,
further comprising an insulating heat transfer sheet that is arranged at least one of between the heat transfer connection portion and the insulating plate and between the insulating plate and the heat dissipation member.

3. The circuit structure according to claim 2,
wherein there are a plurality of the heat transfer sheets, including a first heat transfer sheet arranged between the heat transfer connection portion and the insulating plate and a second heat transfer sheet arranged between the insulating plate and the heat dissipation member.

4. The circuit structure according to claim 2,
wherein the heat transfer sheet is made of an elastically deformable material.

5. The circuit structure according to claim 1,
wherein the heat dissipation member includes a platform portion that projects toward the insulating plate from a position corresponding to the insulating plate.

6. The circuit structure according to claim 1,
wherein the insulating plate is made of an insulating synthetic resin.

* * * * *